US012805135B2

(12) United States Patent
Li et al.

(10) Patent No.: US 12,805,135 B2
(45) Date of Patent: Nov. 17, 2026

(54) DISPLAY PANEL AND DISPLAY DEVICE

(71) Applicant: HKC CORPORATION LIMITED, Shenzhen (CN)

(72) Inventors: Yao Li, Shenzhen (CN); Haijiang Yuan, Shenzhen (CN)

(73) Assignee: HKC CORPORATION LIMITED, Shenzhen (CN)

( * ) Notice: Subject to any disclaimer, the term of this patent is extended or adjusted under 35 U.S.C. 154(b) by 313 days.

(21) Appl. No.: 18/814,311

(22) Filed: Aug. 23, 2024

(65) Prior Publication Data

US 2025/0081781 A1 Mar. 6, 2025

(30) Foreign Application Priority Data

Aug. 31, 2023 (CN) ......................... 202311128866.6

(51) Int. Cl.

*H10K 59/131* (2023.01)
*H10K 59/121* (2023.01)
(Continued)

(52) U.S. Cl.

CPC ....... *H10K 59/131* (2023.02); *H10K 59/1213* (2023.02); *H10K 59/122* (2023.02);
(Continued)

(58) Field of Classification Search

CPC ............. H10K 59/131; H10K 59/1213; H10K 59/122; H10K 59/38; H10K 59/80524;
(Continued)

(56) References Cited

U.S. PATENT DOCUMENTS 8,177,408 B1 * 5/2012 Coleman ................ G02B 3/005 362/621
2007/0052879 A1 * 3/2007 Uehara ............... G02F 1/13476 349/56

(Continued)

FOREIGN PATENT DOCUMENTS

CN 114267710 A 4/2022
CN 114843418 A 8/2022

(Continued)

*Primary Examiner* — Dao H Nguyen

(57) ABSTRACT

A display panel includes a substrate, an electronically controlled switching layer disposed on the substrate, and a light-emitting element layer. Each light-emitting element includes a bottom electrode that is a transparent electrode and used to receive a data signal, a light-emitting layer, and a top electrode that are stacked in sequence in a direction away from the substrate. The electronically controlled switching layer includes multiple first electrodes that are connected to the bottom electrodes in one-to-one correspondence, and that are used to control the electronically controlled switching layer to switch between a first and a second state. When a light-emitting element does not emit light, the electronically controlled switching layer is in the first state to absorb light passing through the bottom electrode. When a light-emitting element emits light, the electronically controlled switching layer is in the second state to reflect the light passing through the bottom electrode.

19 Claims, 4 Drawing Sheets

100

(51) Int. Cl.
*H10K 59/122* (2023.01)
*H10K 59/38* (2023.01)
*H10K 59/80* (2023.01)

(52) U.S. Cl.
CPC ....... *H10K 59/38* (2023.02); *H10K 59/80524* (2023.02); *H10K 59/8792* (2023.02)

(58) Field of Classification Search
CPC ... H10K 59/8792; H10K 59/80; H10K 59/878
See application file for complete search history.

(56) References Cited

U.S. PATENT DOCUMENTS

| | | | | |
|---|---|---|---|---|
| 2010/0302614 | A1* | 12/2010 | Peng | G02B 26/001 359/230 |
| 2013/0215365 | A1* | 8/2013 | Huang | G02F 1/133528 349/96 |
| 2021/0091147 | A1* | 3/2021 | Liu | G02F 1/157 |
| 2022/0085334 | A1* | 3/2022 | Oh | H10K 50/19 |
| 2025/0324868 | A1* | 10/2025 | Li | H10K 59/122 |
| 2026/0186355 | A1* | 7/2026 | Yao | G02F 1/13473 |

FOREIGN PATENT DOCUMENTS

| | | | |
|---|---|---|---|
| KR | 20180074644 | A | 7/2018 |
| WO | 2022206834 | A1 | 10/2022 |

* cited by examiner

DISPLAY PANEL AND DISPLAY DEVICE

CROSS-REFERENCE TO RELATED APPLICATIONS

This application claims the priority and benefit of Chinese patent application number 2023111288666, titled “Display Panel and Display Device” and filed Aug. 31, 2023 with China National Intellectual Property Administration, the entire contents of which are incorporated herein by reference.

TECHNICAL FIELD

This application relates to the field of display technology, and more particularly relates to a display panel and a display device.

BACKGROUND

The description provided in this section is intended for the mere purpose of providing background information related to the present application but doesn’t necessarily constitute prior art.

With the continuous development of OLED (Organic Light-Emitting Diode) display technology, OLED is increasingly used in displays such as smartphones, tablets, computers, and TVs. OLED displays have the advantages of thinness and light weight, high contrast, fast response, wide viewing angle, high brightness, full-color, etc. In order to reduce the reflectivity of external light in an OLED display, the current mainstream solution is attaching a circular polarizer to a light-emitting surface of the OLED display. However, this solution reduces the light-emitting effect due to the relatively great light loss caused by the circular polarizer. Another solution is setting a color filter on the light-emitting surface of the OLED display to improve the light-emitting efficiency through the color filter. Furthermore, the effect of ambient light reflection in the OLED display can be reduced through the arrangement of a black matrix (BM).

However, when the OLED display panel presents a black state when the screen is turned off, ambient light, especially relatively strong ambient light, enters the display panel, reaches the anode of the light-emitting element, and is reflected by the anode to form outgoing light, causing problems such as color mixing and glare when the display panel is in black state.

SUMMARY

It is therefore one purpose of this application to provide a display panel and display device, whereby an electronically controlled switching layer having two states is arranged, and a data signal of the light-emitting element is used to control the state switching of the electronically controlled switching layer. On the one hand, it can improve the phenomenon of color mixing, glare and other phenomena caused by ambient light reflection when the display panel is in the black state. On the other hand, the circuit can be simplified.

This application discloses a display panel, including a substrate, an electronically controlled switching layer, and a light-emitting element layer. The electronically controlled switching layer is disposed on the substrate. The light-emitting element layer is disposed on the electronically controlled switching layer and includes a plurality of light-emitting elements. The light-emitting element includes a bottom electrode, a light-emitting layer, and a top electrode that are stacked in sequence in a direction of getting farther away from the substrate. The bottom electrode is a transparent electrode, and the bottom electrode is used to receive a data signal. The electronically controlled switching layer includes a plurality of first electrodes. The plurality of first electrodes are connected to the plurality of bottom electrodes in one-to-one correspondence. The first electrode is used to control the electronically controlled switching layer to switch between a first state and a second state. When the light-emitting element does not emit light, the electronically controlled switching layer is in the first state for absorbing light passing through the bottom electrode. When the light-emitting element emits light, the electronically controlled switching layer is in a second state for reflecting light passing through the bottom electrode.

In some embodiments, a plurality of double-sided twisting balls are disposed in the electronically controlled switching layer. A first side of the double-sided twisting ball includes a black light-absorbing layer, which is used to absorb the light passing through the bottom electrode. A second side of the double-sided twisting ball includes a reflective layer, which is used to reflect the light passing through the bottom electrode. The first side and second side of the double-sided twisting ball have different electrical polarities. The electronically controlled switching layer further includes a plurality of second electrodes. The plurality of first electrodes are arranged on the side of the double-sided twisting ball facing the light-emitting element. The plurality of second electrodes are arranged on the side of the double-sided twisting ball facing away from the light-emitting element. The first electrode and the second electrode are arranged to face each other in one-to-one correspondence, and the electrical polarities of the first electrode and the corresponding second electrode are opposite. When the light-emitting element does not emit light, the double-sided twisting ball under the light-emitting element is in the first state, and the black light-absorbing layer is disposed to face toward the light-emitting element. When the light-emitting element emits light, the double-sided twisting ball under the light-emitting element is in the second state, and the reflective layer is disposed to face toward the light-emitting element.

In some embodiments, at the position of each light-emitting element, the orthographic projection of the first electrode on the substrate overlaps or coincides with the orthographic projection of the bottom electrode on the substrate, where the first electrode is a transparent electrode.

In some embodiments, at the position of each light-emitting element, the first electrode and the bottom electrode are the same electrode.

In some embodiments, the display panel further includes a control circuit. The control circuit includes a plurality of sub-circuits, and the plurality of sub-circuits are arranged in one-to-one correspondence with the second electrodes. At the position of each light-emitting element, the input terminal of the sub-circuit is connected to the first electrode, and the output terminal of the sub-circuit is connected to the second electrode, so that when the first electrode is at the first voltage level, the second electrode is controlled to be at a second voltage level; when the first electrode is at the second voltage level, the second electrode is controlled to be at the first voltage level. When the first electrode is at the first voltage level, the double-sided twisting ball under the light-emitting element is in the first state. When the first electrode is at the second voltage level, the double-sided twisting ball below the light-emitting element is in the second state.

In some embodiments, the sub-circuit includes a first active switch and a second active switch. A control terminal of the first active switch and a control terminal of the second active switch are each connected to the first electrode. An output terminal of the first active switch and an output terminal of the second active switch are each connected to the second electrode. An input terminal of the first active switch is connected to a gate turn-on voltage. An input terminal of the second active switch is connected to a gate turn-off voltage. When the first electrode is at the first voltage level, the first active switch is turned on. When the first electrode is at the second voltage level, the second active switch is turned on.

In some embodiments, the first active switch is a P-type thin film transistor, and the second active switch is an n-type thin film transistor.

In some embodiments, a potential of the first voltage level lies in the range of 0 to a, and a potential of the second voltage level is not less than a, where a is the starting illuminating voltage of the light-emitting element.

In some embodiments, the substrate includes a driving backplate, which is used to provide data signals for the light-emitting elements. The electronically controlled switching layer is disposed between the driving backplate and the light-emitting element layer. The electronically controlled switching layer includes a plurality of electronically controlled switching portions. The plurality of electronically controlled switching portions are arranged in one-to-one correspondence with the first electrodes. There is a signal line disposed between the electronically controlled switching portions. One end of the signal line is used to connect the first electrode or the bottom electrode, and the other end of the signal line is connected to a driving signal of the driving backplate.

This application discloses a display device, which includes a driving circuit and the above-mentioned display panel, wherein the driving circuit is used to drive the display panel for display.

In this application, the first electrode of the electronically controlled switching layer is connected to the bottom electrode, and the corresponding electronically controlled switching layer is controlled to switch between the first state and the second state according to the data signal. When the light-emitting element does not emit light, the electronically controlled switching layer is in the first state. At this time, the light-emitting element does not emit light, and most of the light reaching the bottom electrode is ambient light. The electronically controlled switching layer absorbs the light passing through the bottom electrode, thereby improving the color mixing, glare and other phenomena caused by ambient light entering the display panel and reflecting when the display panel is in the dark state. When the light-emitting element emits light, the electronic control switches to the second state. This applies to when the light-emitting element emits light. After the light-emitting element emits light, since the anode is also of a transparent state, part of the light is emitted from the anode in the direction of the substrate. Through the reflection effect of the electronically controlled switching layer, this part of the light is reflected to form an outgoing light to improve the light utilization efficiency. In this application, the state of the electronically controlled switching layer is switched to adapt to the different states of whether the light-emitting element emits light, thereby alleviating the problems such as color mixing and glare caused by light reflection in the display panel when in the dark state, thus improving the display effect of the display panel and improving the quality of the display panel. Furthermore, this application does not need to set up additional detection circuits to determine the state of the light-emitting element. Through the data signal of the bottom electrode corresponding to the light-emitting element, the state of the electronically controlled switching layer can be controlled according to the data signal. Relatively speaking, the circuit is simplified and the cost is reduced.

BRIEF DESCRIPTION OF DRAWINGS

The accompanying drawings are used to provide a further understanding of the embodiments according to the present application, and constitute a part of the specification. They are used to illustrate the embodiments according to the present application, and explain the principle of the present application in conjunction with the text description. Apparently, the drawings in the following description merely represent some embodiments of the present disclosure, and for those having ordinary skill in the art, other drawings may also be obtained based on these drawings without investing creative efforts. A brief description of the accompanying drawings is provided as follows.

Figure 1:
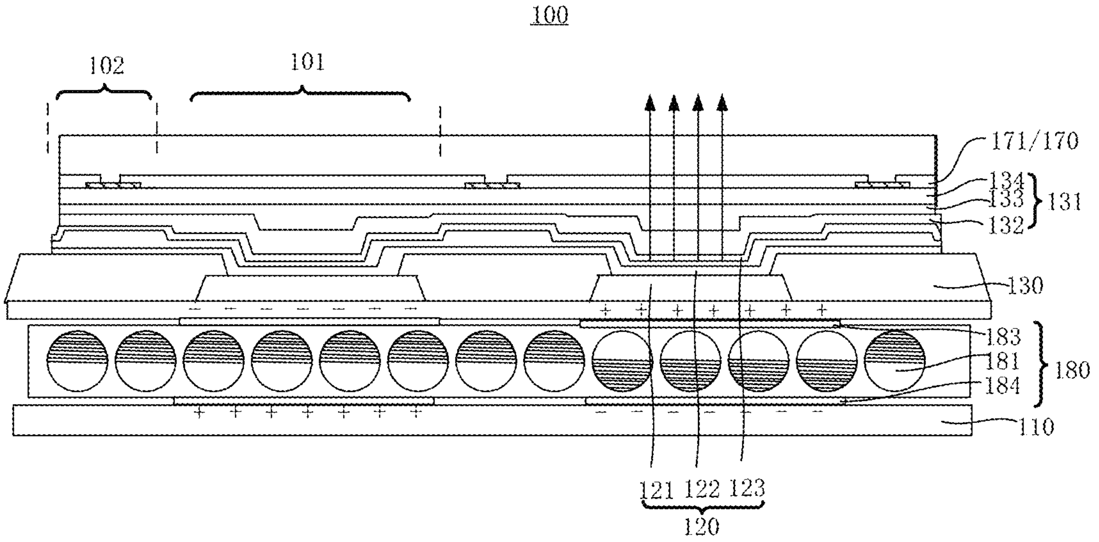
FIG. 1 is a schematic diagram of a display panel according to a first embodiment of this application.

In the drawings: 100, display panel; 101, opening region; 102, non-opening region; 110, substrate; 111, driving backplate; 120, light-emitting element; 121, bottom electrode; 122, light-emitting layer; 123, top electrode; 130, pixel defining layer; 131, encapsulation layer; 132, first inorganic layer; 133, first organic layer; 134, second inorganic layer; 150, sub-circuit; 170, color filter layer; 171, color filter; 180, electronically controlled switching layer; 181, double-sided twisting ball; 181*a*, black light-absorbing layer; 181*b*, reflective layer; 183, first electrode; 184, second electrode; 185, third electrode; 186, fourth electrode; 189, electronically controlled switching portion; 190, shielding piece; 191, hollow tube; 192, wire; 200, display device; 210, driving circuit; T1, first active switch; T2, second active switch; Input, input terminal; Output, output terminal.

DETAILED DESCRIPTION OF EMBODIMENTS

It should be understood that the terms used herein, the specific structures and function details disclosed herein are intended for the mere purposes of describing specific embodiments and are representative. However, this application may be implemented in many alternative forms and should not be construed as being limited to the embodiments set forth herein.

As used herein, terms "first", "second", or the like are merely used for illustrative purposes, and shall not be construed as indicating relative importance or implicitly indicating the number of technical features specified. Thus, unless otherwise specified, the features defined by "first" and "second" may explicitly or implicitly include one or more of such features. Terms "multiple", "a plurality of", and the like mean two or more. In addition, terms "up", "down", "left", "right", "vertical", and "horizontal", or the like are used to indicate orientational or relative positional relationships based on those illustrated in the drawings. They are merely intended for simplifying the description of the present disclosure, rather than indicating or implying that the device or element referred to must have a particular orientation or be constructed and operate in a particular orientation. Therefore, these terms are not to be construed as restricting the present disclosure. For those of ordinary skill in the art, the specific meanings of the above terms as used in the present application can be understood depending on specific contexts.

Hereinafter this application will be described in further detail with reference to the accompanying drawings and some optional embodiments.

FIG. 1 is a schematic diagram of a display panel according to a first embodiment of this application. As illustrated in FIG. 1, this application discloses a display panel 100. The display panel 100 includes a substrate 110, an electronically controlled switching layer 180, and a light-emitting element 120.

The light-emitting element layer is disposed on the electronically controlled switching layer 180. A plurality of light-emitting elements 120 are arranged in an array on the light-emitting element layer. The light-emitting element 120 includes a bottom electrode 121, a light-emitting layer 122, and a top electrode 123 that are stacked in sequence along a direction of getting farther away from the substrate 110. The bottom electrode 121 is a transparent electrode. The bottom electrode 121 is used to receive a data signal. When the bottom electrodes 121 at different positions receive different data signals, the light-emitting elements 120 corresponding to the bottom electrodes 121 emit different brightness.

The electronically controlled switching layer 180 is disposed on the substrate 110. The electronically controlled switching layer 180 includes a plurality of first electrodes 183. The plurality of first electrodes 183 are connected in one-to-one correspondence with the plurality of bottom electrodes 121. The first electrode 183 is used to control the respective electronically controlled switching layer 180 to switch between a first state and a second state. When the light-emitting element 120 does not emit light, the respective electronically controlled switching layer 180 is in the first state for absorbing the light passing through the bottom electrode 121. When the light-emitting element 120 emits light, the electronically controlled switching layer 180 is in the second state for reflecting the light passing through the bottom electrode 121.

In this application, the first electrode 183 of the electronically controlled switching layer 180 is connected to the bottom electrode 121, and the corresponding electronically controlled switching layer 180 is controlled to switch between the first state and the second state according to the data signal. When the light-emitting element 120 does not emit light, the electronically controlled switching layer 180 is in the first state. At this time, the light-emitting element 120 does not emit light, and most of the light reaching the bottom electrode 121 is ambient light. The electronically controlled switching layer 180 absorbs the light passing through the bottom electrode 121, thereby improving the color mixing, glare and other phenomena caused by ambient light entering the display panel 100 and reflecting when the display panel 100 is in the dark state. When the light-emitting element 120 emits light, the electronic control switches to the second state. This applies to when the light-emitting element 120 emits light. After the light-emitting element 120 emits light, since the anode is also of a transparent state, part of the light is emitted from the anode in the direction of the substrate 110. Through the reflection effect of the electronically controlled switching layer 180, this part of the light is reflected to form an outgoing light to improve the light utilization efficiency. In this application, the state of the electronically controlled switching layer 180 is switched to adapt to the different states of whether the light-emitting element 120 emits light, thereby alleviating the problems such as color mixing and glare caused by light reflection in the display panel 100 when in the dark state, thus improving the display effect of the display panel 100 and improving the quality of the display panel 100. Furthermore, this application does not need to set up additional detection circuits to determine the state of the light-emitting element 120. Through the data signal of the bottom electrode 121 corresponding to the light-emitting element 120, the state of the electronically controlled switching layer 180 can be controlled according to the data signal. Relatively speaking, the circuit is simplified and the cost is reduced.

The display panel 100 of this application may use a POL-less technology. That is, a color filter is disposed on the light-emitting surface of the OLED display to replace the polarizer, also known as COE (Color filter on Encapsulation) display technology. Compared with polarizers, color filters may be used to improve light-emitting efficiency, but the corresponding ambient light reflection problem is also more significant. This application utilizes a double-sided twisting ball 181 in dual-color twisting ball display technology. It may refer to dividing a ball into two halves and painting the two halves white and black respectively to form a spherical particle. Then a silicone seat adhesive is used to apply the dual-color balls on a base sheet and a cavity is formed around the particle and filled with a specific liquid. The white side of the particle surface is negative and the black side is positive, so that different charges are present between the two colors to form a dipole, whose direction is controlled by an electric field.

Figure 2:
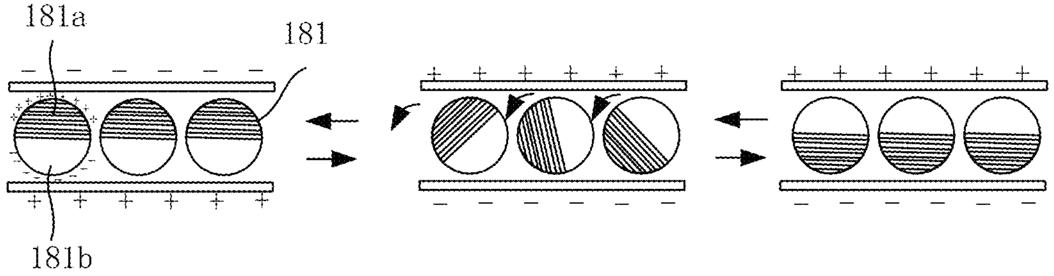
FIG. 2 is a schematic diagram of a double-sided twisting ball according to this application.

FIG. 2 is a schematic diagram of a double-sided twisting ball according to the present application. As illustrated in FIG. 2, based on the above structure of the dual-color twisting ball, in this embodiment, half of the surface of the spherical particle is coated with a black light-absorbing coating, that is, a black light-absorbing layer 181*a* is formed, and half is coated with a total reflection coating, that is, reflective layer 181*b*. The two sides have different electrical polarities. In this application, the total reflection coating has a "−" negative charge, and the black light-absorbing layer 181*a* has a "+" positive charge, for purposes of description.

A plurality of double-sided twisting balls 181 may be disposed in the electronically controlled switching layer 180. A black light-absorbing layer 181*a* is disposed on a first side of the double-sided twisting ball 181. The black light-absorbing layer 181*a* is used to absorb the light passing through the bottom electrode 121. A reflective layer 181*b* is disposed on a second side of the double-sided twisting ball 181. The reflective layer 181*b* is used to reflect the light passing through the bottom electrode 121. The first side and the second side of the double-sided twisting ball 181 have different electrical polarities. The electronically controlled switching layer 180 further includes a plurality of second electrodes 184. The plurality of first electrodes 183 are arranged on the side of the double-sided twisting ball 181 facing towards the light-emitting element 120. The plurality of second electrodes 184 are arranged on the side of the double-sided twisting ball 181 facing away from the light-emitting element 120. The first electrodes 183 and the second electrodes 184 are arranged facing each other in one-to-one correspondence, and the electrical polarities of the first electrode 183 and the corresponding second electrode 184 are opposite. When the light-emitting element 120 does not emit light, the respective double-sided twisting ball 181 below the light-emitting element 120 is in the first state, and the corresponding black light-absorbing layer 181*a* is disposed facing toward the light-emitting element 120. When the light-emitting element 120 emits light, the double-sided twisting ball 181 below the light-emitting element 120 is in the second state, and the reflective layer 181*b* is disposed facing toward the light-emitting element 120.

In this embodiment, voltages of different polarities may be applied to the first electrode 183 and the second electrode 184 respectively to drive the double-sided twisting ball 181 to rotate. When the black light-absorbing layer 181*a* is positively charged and the reflective layer 181*b* is negatively charged. By driving the first electrode 183 to be positively charged and the second electrode 184 to be negatively charged, the black light-absorbing layer 181*a* of the double-sided twisting ball 181 is disposed facing towards the second electrode 184, and the reflective layer 181*b* is disposed facing towards the first electrode 183. At this time, it is in the second state, in which the reflective layer 181*b* reflects the light emitted downward from the bottom electrode 121 thereby creating an outgoing light. When the first electrode 183 is negatively charged and the second electrode 184 is positively charged, the black light-absorbing layer 181*a* of the double-sided twisting ball 181 is disposed facing towards the first electrode 183, and the reflective layer 181*b* is disposed facing towards the second electrode 184. At this time, it is in the first state, and the black light-absorbing layer 181*a* absorbs the external ambient light that enters the display panel 100 and passes through the anode.

It should be understood that in the light-emitting elements 120, the top electrodes 123 of the plurality of light-emitting elements 120 are connected together and supplied with the same voltage. Through the thin film transistors disposed under the bottom electrodes 121, different data signals are controlled to be supplied to the bottom electrodes 121 of different light-emitting elements 120 thus realizing display. The bottom electrode 121 may need to use a metal electrode with a relatively high reflectivity as the anode of the light-emitting element 120 to emit most of the light from the side at the top electrode 123. Of course, there is also a composite electrode using a stack of a transparent conductive layer and a metal electrode as the anode. The top electrode 123 may use a transparent conductive layer as the cathode of the light-emitting element 120. Since the bottom electrode 121 has a relatively high reflectivity, driven by a certain voltage, electrons and holes respectively move from the cathode and anode to the light-emitting layer 122, and then recombine to emit visible light. Therefore, the light-emitting element 120 may emit light in one direction, such as a bottom-emitting light-emitting element 120. There is also a top-emitting light-emitting element 120, in which the materials of the anode and cathode are exchanged to form light emitted from top to bottom.

In this application, the bottom electrode 121 may be formed of a transparent conductive material or a conductive material having a relatively low reflectivity. When the light-emitting element 120 normally emits light, the reflective layer 181*b* of the electronically controlled switching layer 180 is used to replace the bottom electrode 121 with a relatively high reflectivity that may be required, which can also achieve lower light loss when the light-emitting element 120 emits light.

Continuing to refer to FIG. 1, the display panel 100 further includes a pixel defining layer 130, an encapsulation layer, and a color filter layer. The display panel 100 may be divided into an opening region 101 and a non-opening region 102 according to the position of the pixel defining layer 130. The opening region 101 may refer to the position of the color filter, that is, the area where RGB colors can be displayed during display, which roughly corresponds to the area between the adjacent pixel defining layers 130 of the display panel 100. The non-opening region 102 refers to the position of the black matrix, that is, the area that appears black when displayed, roughly corresponding to the area of pixel defining layer 130. The opening region 101 and the non-opening region 102 may both be located in the display area of the display panel 100.

The encapsulation layer 131 is used to be disposed to cover the light-emitting element 120 and the pixel defining layer 130. The color filter layer is arranged on the encapsulation layer 131. The encapsulation layer 131 may include a first inorganic layer 132, a first organic layer 133, and a second inorganic layer 134. The color filter layer 170 includes a plurality of color filters 171. The plurality of color filters 171 are disposed in opening regions 101. The color filters 171 include a red color filter, a blue color filter, and a green color filter.

The light-emitting elements 120 in this embodiment include a red light-emitting element RR, a green light-emitting element GG, and a blue light-emitting element BB. The red light-emitting element R, the green light-emitting element G, and the blue light-emitting element B are arranged in an array. The display panel 100 in this embodiment is an OLED display panel 100 using the RGB light-emitting elements 120 as the light sources. Of course, the light-emitting element 120 in this application may also be a white light-emitting element, realizing an OLED display panel 100 using white light as the light source. When the light-emitting elements 120 of the display panel 100 are RGB type light-emitting elements, then the red color filter is disposed corresponding to the red light-emitting element R, the green color filter is disposed corresponding to the green light-emitting element G, and the blue color filter is disposed corresponding to the blue light-emitting element B. When the display panel 100 uses a white light-emitting element 120, then the red color filters, the green color filters, and the blue color filters may be arranged in an array.

Figure 3:
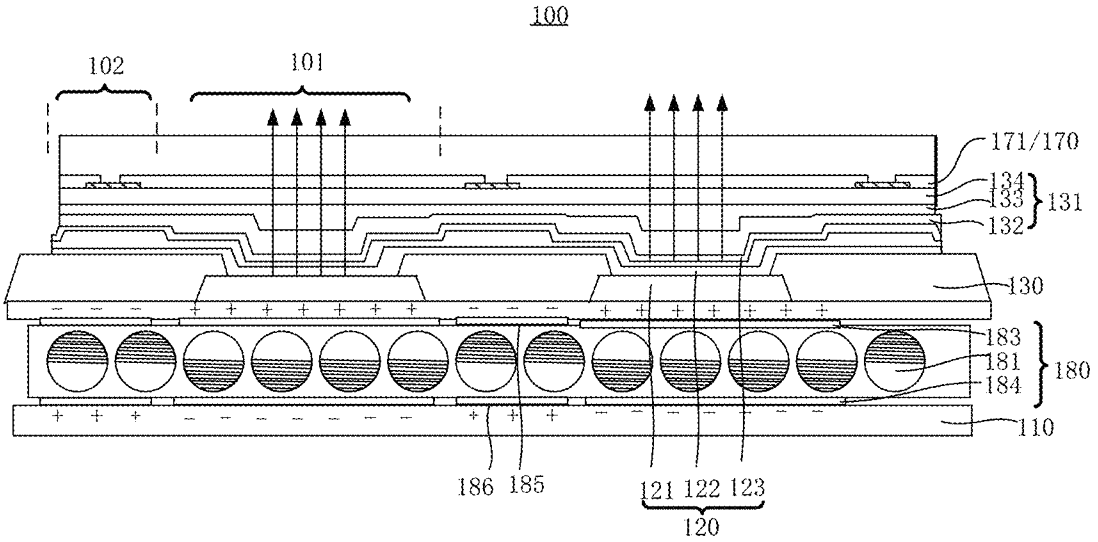
FIG. 3 is a schematic diagram of a display panel according to a second embodiment of this application.

FIG. 3 is a schematic diagram of a display panel according to a second embodiment of this application. Based on FIG. 1, a third electrode 185 and a fourth electrode 186 may be further added. The electronically controlled switching layer 180 may further include a plurality of third electrodes 185 and a plurality of fourth electrodes 186. The plurality of third electrodes 185 and fourth electrodes 186 are arranged in the non-opening region 102 and are arranged corresponding to the pixel defining layer 130. The plurality of third electrodes 185 and the plurality of first electrodes 183 are alternately arranged at intervals. The plurality of fourth electrodes 186 and the plurality of second electrodes 184 are alternately arranged at intervals. The plurality of third electrodes 185 are electrically connected to each other, and the plurality of fourth electrodes 186 are electrically connected to each other, for controlling the double-sided twisting balls 181 corresponding to the non-opening region 102 to always be in the first state. Adjacent light-emitting elements 120 are separated by the pixel defining layer 130, but the pixel defining layer 130 has a certain width. Therefore, the double-sided twisting balls 181 under the pixel defining layer 130 need to be fixed in the first state in which the black light-absorbing layer 181*a* facing the pixel defining layer 130, so that the large-angle light in the ambient light that enters the interior of the display panel 100 can also be absorbed by the electronically controlled switching layer 180 disposed in the non-opening region 102.

Figure 4:
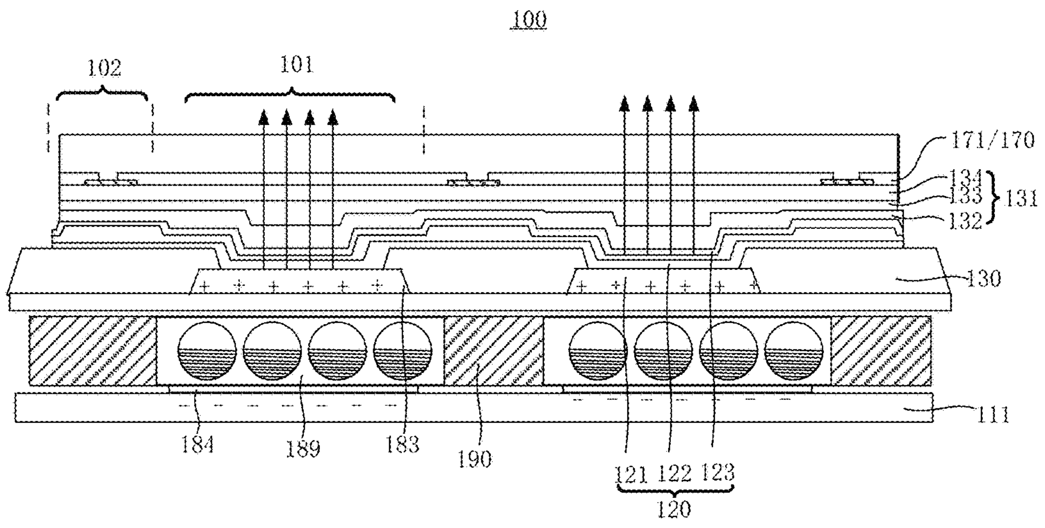
FIG. 4 is a schematic diagram of a display panel according to a third embodiment of this application.

FIG. 4 is a schematic diagram of a display panel according to a third embodiment of this application. As illustrated in FIG. 4, in another embodiment, the electronically controlled switching layer 180 may include a plurality of electronically controlled switching portions 189 disposed in the opening region 101. A shielding piece 190 is disposed between every two adjacent electronically controlled switching portions 189, and the shielding piece 190 is disposed corresponding to the non-opening region 102. The difference from the previous embodiment is that it is not an electronically controlled switching layer 180 in the form of an entire layer. Instead, the electronically con-trolled switching layer 180 is separated into pixel-level electronically controlled switching portions 189 to achieve the above effect. Relatively speaking, the number of electrodes in the non-opening region 102 can be reduced to weaken the coupling effect between electrodes.

In this application, each first electrode 183 and each second electrode 184 can be driven independently.

Figure 5:
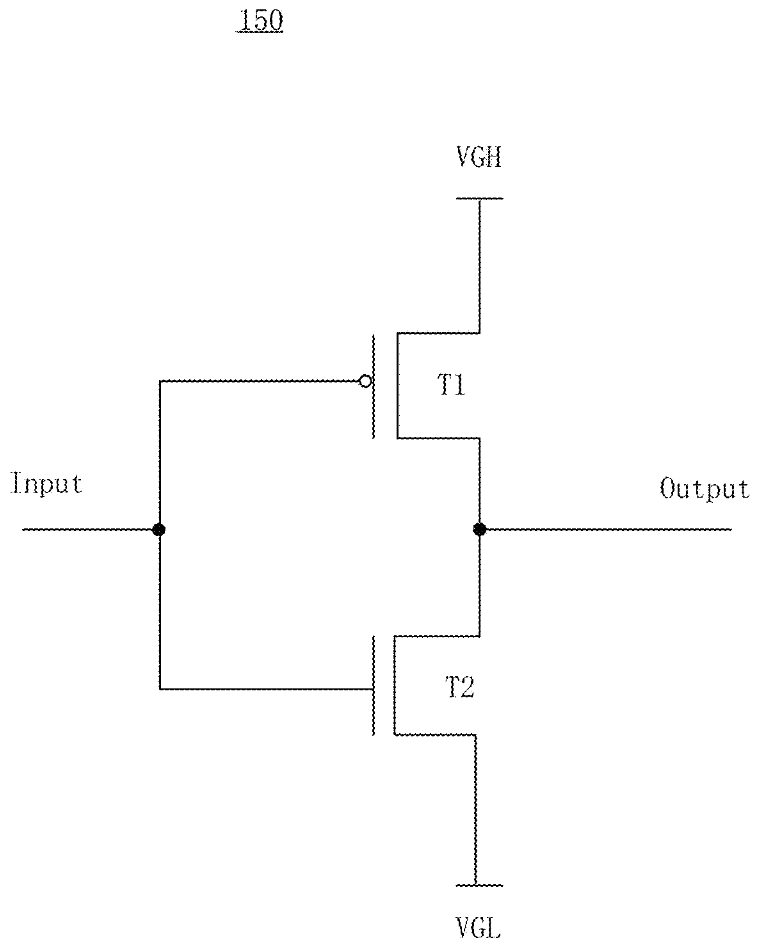
FIG. 5 is a schematic diagram of a first sub-circuit according to this application.

FIG. 5 is a schematic diagram of a first sub-circuit according to this application. Referring to FIG. 5, the display panel 100 may further include a control circuit. The control circuit includes a plurality of sub-circuits 150. The plurality of sub-circuits 150 are arranged in one-to-one correspondence with the second electrodes 184. At the position of each light-emitting element 120, the input terminal Input of the sub-circuit 150 is connected to the first electrode 183, and the output terminal Output of the sub-circuit 150 is connected to the second electrode 184. The sub-circuit 150 is used to control the second electrode 184 to be at the second voltage level when the first electrode 183 is at the first voltage level, and to control the second electrode 184 to be at the first voltage level when the first electrode 183 is at the second voltage level.

When the first electrode 183 is at the first voltage level, the double-sided twisting ball 181 under the light-emitting element 120 is in the first state. When the first electrode 183 is at the second voltage level, the double-sided twisting ball 181 under the light-emitting element 120 is in the second state.

In this application, the voltage corresponding to the second electrode 184 is selected based on the data signal received by the first electrode 183 by setting the sub-circuit 150. For example, in order to enable the electronically controlled switching layer 180 to be in the first state, it is needed to make the first electrode 183 be at the first voltage level and the second electrode 184 be at the second voltage level. After the double-sided twisting ball 181 is rotated by the driving of the first electrode 183 and the second electrode 184, the black light-absorbing layer 181*a* is located on the side facing towards the bottom electrode 121, and the reflective layer 181*b* is located on the side facing away from the bottom electrode 121.

The potential of the first voltage level lies in the range of 0 to a, and the potential of the second voltage level is not less than a, where a is a starting illuminating voltage of the light-emitting element 120. The starting illuminating voltage means that when the voltage of the anode is equal to the value of this starting illuminating voltage, the light-emitting element 120 emits light. This value is the minimum illuminating voltage. When the voltage of the anode is lower than this value, the light-emitting element 120 may not emit light. When the voltage of the anode is higher than this value, the higher the voltage, the higher the brightness of the light-emitting element 120. The starting illuminating voltage of the blue light-emitting element B may be greater than the starting illuminating voltage of the red light-emitting element R and the green light-emitting element G, where a lies in the range of 1V to 2V.

This embodiment may use signals within the display panel 100 to control the first electrode 183 and the second electrode 184. The sub-circuit 150 includes a first active switch T1 and a second active switch T2. The control terminal of the first active switch T1 and the control terminal of the second active switch T2 are each connected to the first electrode 183. The output terminal Output of the first active switch T1 and the output terminal Output of the second active switch T2 are each connected to the second electrode 184. The input terminal input of the first active switch T1 is connected to a gate turn-on voltage (VGH). The input terminal Input of the second active switch T2 is connected to a gate turn-off voltage (VGL).

Of course, in the pixel driving circuit of the display panel 100, the gate turn-on voltage may be replaced by a power supply voltage VDD, etc., and the gate turn-off voltage may be replaced by a ground voltage VSS.

Figure 6:
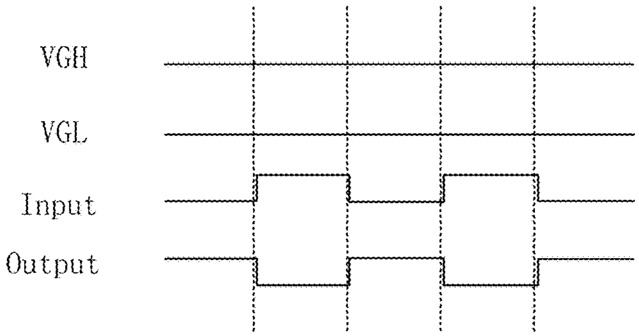
FIG. 6 is a timing diagram of a sub-circuit according to this application.

FIG. 6 is a timing diagram of a sub-circuit according to this application. As illustrated in FIG. 6, when the light-emitting element 120 does not emit light, the data signal corresponding to the light-emitting element 120 is a low level, which is below the starting illuminating voltage. When the first electrode 183 is at the first voltage level, the first active switch T1 is turned on, and the second active switch T2 is turned off. The sub-circuit 150 outputs a VGH signal, and the corresponding second electrode 184 is at a high level thus forming a potential difference with the first electrode 183, which controls the black light-absorbing layer 181*a* of the double-sided twisting ball 181 to be oriented towards the light-emitting element 120, and the reflective layer 181*b* to face away from the light-emitting element 120, so that the electronically controlled switching layer 180 is in the first state, i.e., the black light-absorbing state. When the light-emitting element 120 emits light, the corresponding data signal of the light-emitting element 120 is at high level, which is at least greater than or equal to the starting illuminating voltage. When the first electrode 183 is at the second voltage level, the first active switch T1 is turned off and the second active switch T2 is turned on. As such, the sub-circuit 150 outputs a VGL signal, and the corresponding second electrode 184 is at a low level, so that a potential difference is created between the first electrode 183 and the second electrode 184, which controls the black light-absorbing layer 181*a* of the double-sided twisting ball 181 to face away from the light-emitting element 120, and the reflective layer 181*b* to be disposed facing toward the light-emitting element 120, so that the electronically controlled switching layer 180 is in the second state, i.e., the light reflecting state. The first active switch T1 may be a p-type thin film transistor, the second active switch T2 may be an n-type thin film transistor, and the threshold voltage of each of the first active switch T1 and the second active switch T2 may lie in the range of 0-1V.

When realizing normal image display on the display panel 100, a single pixel may include R, G, and B subpixels. Some images require that in a single pixel one subpixel emits light while other subpixels do not. Here, the scenario in which the G subpixel is bright while the brightness of the R and B subpixels is zero for purposes of illustration. When the G subpixel needs to be displayed, the reflective layer 181*b* of the double-sided twisting ball 181 below it is adjusted to be situated upward to ensure normal display. Furthermore, the double-sided twisting balls 181 below the R and B subpixels need to adjust the respective black light-absorbing layers 181*a* to be situated upward to absorb the ambient light thus presenting a black state. For products of the COE structure without functional structural layers, the G and B subpixels may also release part of the ambient light, resulting in a slight color mixing phenomenon at the display edge of the B subpixel. Furthermore, the blackness of the R and B subpixels is also insufficient. According to this, products of the COE structure having functional structural layers may effectively improve the display contrast.

Figure 7:
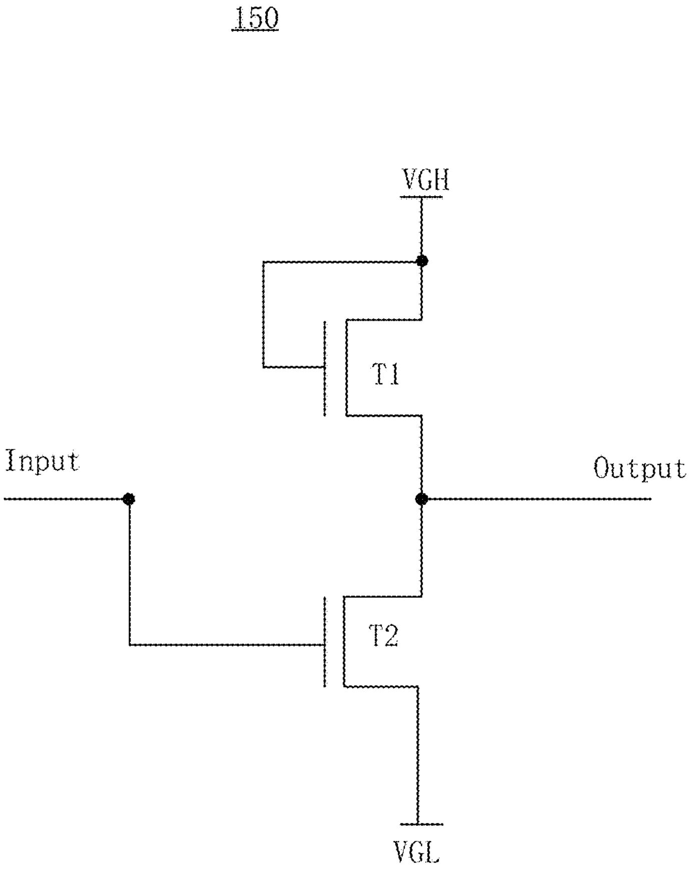
FIG. 7 is a schematic diagram of a second sub-circuit according to this application.

FIG. 7 is a schematic diagram of a second sub-circuit according to this application. As illustrated in FIG. 7, based on the previous sub-circuit 150, the control terminal of the first active switch T1 is also connected to the VGH signal. In this embodiment, the first active switch T1 and the second active switch T2 may use the same type of TFT, such as N-type TFT. The timing in this embodiment is basically the same as that in the previous embodiment and so will not be detailed here again.

However, in the above two types of sub-circuits 150, there is the same problem that the speed of the second active switch T2 pulling down the voltage in reverse is not enough. It is needed to adjust the driving capabilities of the first active switch T1 and the second active switch T2 so that the driving capability of the second active switch T2 is greater than the driving capability of the first active switch T1 to ensure that the output terminal of the sub-circuit 150 can be pulled down to low potential in time when the second active switch T2 is at the pull-down state. The main purpose of the sub-circuit 150 of this application is to let the first electrode 183 and the second electrode 184 be at different potentials to control the double-sided twisting ball 181. For solutions using other control circuits, if they can achieve the purpose of this embodiment, they should also be included in the scope of protection of this application.

In another embodiment, when multiple light-emitting elements 120 in the display panel 100 are displayed as one subpixel, that is, multiple light-emitting elements 120 are disposed in one subpixel, then the bottom electrodes 121 of the multiple light-emitting elements 120 in this area are connected to each other, and the top electrodes 123 of the multiple light-emitting elements 120 in this area are also connected together. Correspondingly, the first electrode 183 of the electronically controlled switching layer 180 is disposed to cover one subpixel, that is, it is disposed to cover the multiple light-emitting elements 120 included in one subpixel.

At the position of each light-emitting element 120, the orthographic projection of the first electrode 183 on the substrate 110 may overlap or coincide with the orthographic projection of the bottom electrode 121 on the substrate 110.

The first electrode 183 may be a transparent electrode. The first electrode 183 may be a mesh electrode or a whole electrode, or it may be a plurality of electrode blocks that are connected together, which is not limited here.

It may be understood that the first electrode 183 and the bottom electrode 121 of the present application may share an electrode, or two transparent conductive layers may be provided as the first electrode 183 and the bottom electrode 121. When first electrode 183 and bottom electrode 121 share an electrode, an isolation layer may be disposed under first electrode 183/bottom electrode 121. The electronically controlled switching layer 180 may be disposed below the isolation layer to prevent the electronically controlled switching layer 180 from affecting the light-emitting element 120. The isolation layer and the encapsulation layer may adopt at least one layer of inorganic or organic layers, or multiple layers of inorganic or organic layers may be stacked together.

In another embodiment, the substrate 110 includes a driving backplate 111, which is used to at least provide a data signal for the light-emitting element 120. The electronically controlled switching layer 180 is disposed between the driving backplate 111 and the light-emitting element layer. The electronically controlled switching layer 180 includes a plurality of electronically controlled switching portions 189. The plurality of electronically controlled switching portions 189 are arranged in one-to-one correspondence with the first electrodes 183. A signal line is disposed between the electronically controlled switching portions 189. One end of the signal line is connected to the first electrode 183 or the bottom electrode 121. The other end of the signal line is connected to the driving circuit on the driving backplate 111.

A TFT array layer is disposed on the driving backplate 111, and is used to input data signals for each of the light-emitting elements 120 that are arranged in an array through row driving technology.

The electronically controlled switching layer 180 in this solution is located below the bottom electrode 121 and above the driving backplate 111. The second electrode 184 is located below the lower base sheet of the twisting ball and can directly contact the driving backplate 111. The metal film layer of the driving backplate 111 is used as the second electrode 184. Because the data voltage of the bottom electrode 121 also needs to be fed by the driving backplate 111, the data signal of the bottom electrode 121 needs to pass through the functional structure layers and reach the driving backplate 111 to achieve signal connection.

Figure 8:
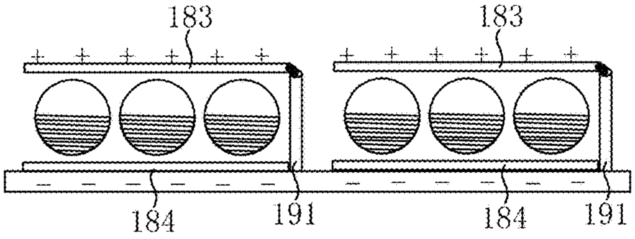
FIG. 8 is a schematic diagram of an electronically controlled switching layer according to an embodiment of this application.

Based on this actual situation, this proposal proposes a connection method. FIG. 8 is a schematic diagram of an electronically controlled switching layer according to an embodiment of the present application. A hollow tube 191 made of an organic material is arranged in the non-opening region 102 of the electronically controlled switching layer 180 (between the two first electrodes 183), the diameter may lie within 5 um. During actual preparation, the lower base sheet of the electronically controlled switching layer 180 may be punched in advance at the position corresponding to the hollow tube, and the corresponding organic material may be placed at the punched position to form the hollow tube 191, which is fixed by heating or other organic curing methods. After being fixed, the double-sided twisting balls 181 are printed, and finally the upper base sheet punched with holes in the same manner is bonded and encapsulated. Finally, the corresponding first electrode 183 is printed or sprayed on the upper base sheet, and then the wire (elastic wire/liquid metal solidification/metal coating, etc.) is used to connect the first electrode 183 to the driving backplate 111 through the hollow tube 191.

It can be understood that the structure of the electronically controlled switching layer 180 of this application may include two base sheets: an upper and a lower base sheet. The upper base sheet needs to be made of a transparent material, such as glass, etc. The lower base sheet may share the above-mentioned substrate 110 or driving backplate 111, etc. The light-emitting element 120 is formed on the upper base sheet. The double-sided twisting ball 181 is encapsulated between upper base sheet and lower base sheet. The electronically controlled switching layer 180 of this application requires two upper and lower substrates to encapsulate the double-sided twisting balls 181.

Figure 9:
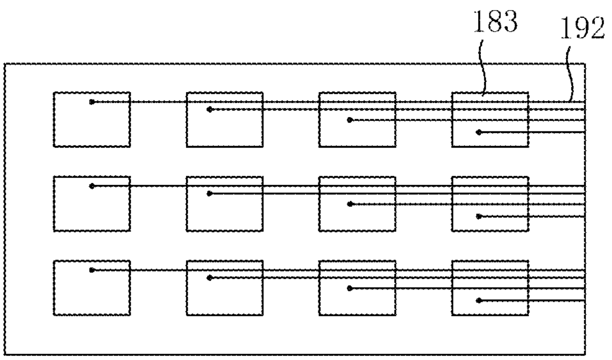
FIG. 9 is a schematic diagram of an electronically controlled switching layer according to another embodiment of this application.

FIG. 9 is a schematic diagram of the electronically controlled switching layer according to another embodiment of this application. As illustrated in FIG. 9, this embodiment provides another connection method, that is, connecting the bottom electrode 121 to the driving backplate 111 through side wiring connected the bottom electrode 121. The second electrode 184 may still be directly disposed on the driving backplate 111, and the metal film layer of the driving backplate 111 may be used as the second electrode 184. If space permits, the wires 192 disposed on the same layer as the bottom electrodes 121 may be used to be connected to the bottom electrode 121 of each light-emitting element 120. Otherwise, when the space is not enough to use the metal layer in the same layer, another layer of wires 192 may be added, and the metal layer is used to connect the wires 192 to each bottom electrode 121 in a one-to-one correspondence by drilling holes. Then one may lead all the wires 192 to the edge of the base sheet, and further lead them into the driving backplate 111 through edge leads or edge punching, then connect them to the corresponding pixel regions, and connect them to the wires of the bottom electrodes 121 in the pixels for signal conduction.

In this solution, with regards to the sub-circuit 150 driving method used by the electronically controlled switching layer 180, this embodiment merely takes the double-sided twisting ball 181 as an example, such as ink in electronic paper, or a similar liquid crystal layer, as long as it needs to be realized by using the voltage formed between the first electrode 183 and the second electrode 184 on both sides. No matter where it is located in the OLED layer structure, it can be driven by the sub-circuit 150 in this proposal, which can effectively solve the driving problem.

Figure 10:
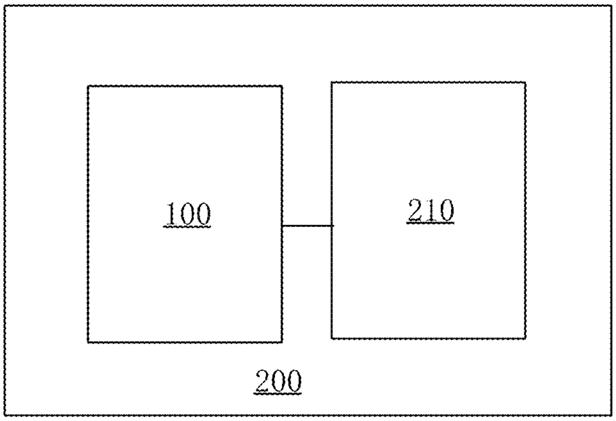
FIG. 10 is a schematic diagram of a display device according to this application.

FIG. 10 is a schematic diagram of a display device according to this application. As illustrated in FIG. 10, this application discloses a display device. The display device 200 includes a driving circuit 210 and the display panel 100 as described in any of the above embodiments. The driving circuit 210 is used to drive the display panel 100.

In this application, the first electrode 183 of the electronically controlled switching layer 180 is connected to the bottom electrode 121, and the corresponding electronically controlled switching layer 180 is controlled to switch between the first state and the second state according to the data signal. When the light-emitting element 120 does not emit light, the electronically controlled switching layer 180 is in the first state. At this time, the light-emitting element 120 does not emit light, and most of the light reaching the bottom electrode 121 is ambient light. The electronically controlled switching layer 180 absorbs the light passing through the bottom electrode 121, thereby improving the color mixing, glare and other phenomena caused by ambient light entering the display panel 100 and reflecting when the display panel 100 is in the dark state. When the light-emitting element 120 emits light, the electronic control switches to the second state. This applies to when the light-emitting element 120 emits light. After the light-emitting element 120 emits light, since the anode is also of a transparent state, part of the light is emitted from the anode in the direction of the substrate 110. Through the reflection effect of the electronically controlled switching layer 180, this part of the light is reflected to form an outgoing light to improve the light utilization efficiency. In this application, by switching the state of the electronically controlled switching layer 180 to adapt to different states of whether the light-emitting element 120 emits light, problems such as color mixing or glare caused by light reflection in the black state of the display panel 100 are improved, the display effect of the display panel 100 is improved, and the display taste is improved. Furthermore, this application does not need to set up additional detection circuits to determine the state of the light-emitting element 120. Through the data signal of the bottom electrode 121 corresponding to the light-emitting element 120, the state of the electronically controlled switching layer 180 can be controlled according to the data signal. Relatively speaking, the circuit is simplified and the cost is reduced.

It should be noted that the inventive concept of the present application can be formed into many embodiments, but the length of the application document is limited and so these embodiments cannot be enumerated one by one. The technical features can be arbitrarily combined to form a new embodiment, and the original technical effect may be enhanced after the various embodiments or technical features are combined.

The foregoing description is merely a further detailed description of the present application made with reference to some specific illustrative embodiments, and the specific implementations of the present application will not be construed to be limited to these illustrative embodiments. For those having ordinary skill in the technical field to which this application pertains, numerous simple deductions or substitutions may be made without departing from the concept of this application, which shall all be regarded as falling in the scope of protection of this application.

What is claimed is:

1. A display panel, comprising:

a substrate;

an electronically controlled switching layer, disposed on the substrate; and a light-emitting element layer, disposed on the electronically controlled switching layer and comprising a plurality of light-emitting elements; wherein each of the plurality of light-emitting elements comprises a bottom electrode, a light-emitting layer, and a top electrode that are stacked in sequence in a direction of getting farther away from the substrate; wherein the bottom electrode is a transparent electrode and is used to receive a data signal;

wherein the electronically controlled switching layer comprises a plurality of first electrodes, wherein the plurality of first electrodes are connected to the plurality of bottom electrodes in one-to-one correspondence, and wherein the plurality of first electrodes are used to control the electronically controlled switching layer to switch between a first state and a second state;

wherein in response to each of the plurality of light-emitting elements not emitting light, the electronically controlled switching layer enters the first state in which the electronically controlled switching layer is operative to absorb light passing through the bottom electrode;

wherein in response to each of the plurality of light-emitting elements emitting light, the electronically controlled switching layer enters the second state in which the electronically controlled switching layer is operative to reflect the light passing through the bottom electrode.

2. The display panel as recited in claim 1, wherein there is disposed a plurality of double-sided twisting balls in the electronically controlled switching layer, wherein a first side of each of the plurality of double-sided twisting balls comprises a black light-absorbing layer, which is used to absorb the light passing through the bottom electrode;

wherein a second side of each of the plurality of double-sided twisting balls comprises a reflective layer, which is used to reflect the light passing through the bottom electrode; wherein the first side and second side of each of the plurality of double-sided twisting balls have different electrical polarities.

3. The display panel as recited in claim 2, wherein the electronically controlled switching layer further comprises a plurality of second electrodes; wherein the plurality of first electrodes are disposed on the side of the plurality of double-sided twisting balls facing towards the plurality of light-emitting elements; wherein the plurality of second electrodes are disposed on the side of the plurality of double-sided twisting balls facing away from the plurality of light-emitting elements; wherein the plurality of first electrodes and the plurality of second electrodes are arranged facing each other in one-to-one correspondence, and wherein each first electrode and the respective second electrode have opposite electrical polarities;

wherein in response to each of the plurality of light-emitting elements not emitting light, the respective double-sided twisting balls under the light-emitting element enter the first state, in which the black light-absorbing layers of the respective double-sided twisting balls are disposed to face toward the light-emitting element;

wherein in response to each of the plurality of light-emitting elements emitting light, the respective double-sided twisting balls under the light-emitting element enter the second state, in which the reflective layers of the respective double-sided twisting balls are disposed to face toward the light-emitting element.

4. The display panel as recited in claim 3, wherein the display panel comprises an opening region and a non-opening region; wherein the electronically controlled switching layer further comprises a plurality of third electrodes and a plurality of fourth electrodes, the plurality of third electrodes and the plurality of fourth electrodes being disposed in the non-opening region and corresponding to the pixel defining layer; wherein the plurality of third electrodes and the plurality of first electrodes are alternately arranged at intervals, and wherein the plurality of fourth electrodes and the plurality of second electrodes are alternately arranged at intervals;

wherein the plurality of third electrodes are electrically connected to each other, and wherein the plurality of fourth electrodes are electrically connected to each other; wherein the plurality of third electrodes and the plurality of fourth electrodes are used to control the double-sided twisting balls corresponding to the non-opening region to be always in the first state.

5. The display panel as recited in claim 3, further comprising a control circuit, the control circuit comprising a plurality of sub-circuits, and wherein the plurality of sub-circuits are arranged in one-to-one correspondence with the plurality of second electrodes;

wherein at the position of each of the plurality of light-emitting elements, an input terminal of the respective sub-circuit is connected to the respective first electrode, and an output terminal of the respective sub-circuit is connected to the respective second electrode; wherein the respective sub-circuit is used to control the respective second electrode to be at a second voltage level in response to the respective first electrode being at a first voltage level, and to control the respective second electrode to be at the first voltage level in response to the respective first electrode being at the second voltage level;

wherein in response to the first electrode being at the first voltage level, the corresponding double-sided twisting balls under the respective light-emitting element enter the first state;

wherein in response to the first electrode being at the second voltage level, the corresponding double-sided twisting balls under the respective light-emitting element enter the second state.

6. The display panel as recited in claim 5, wherein each of the plurality of sub-circuits comprises a first active switch and a second active switch; wherein a control terminal of the first active switch and a control terminal of the second active switch are each connected to the respective first electrode; wherein an output terminal of the first active switch and an output terminal of the second active switch are each connected to the respective second electrode; wherein an input terminal of the first active switch is connected to a gate turn-on voltage, and an input terminal of the second active switch is connected to a gate turn-off voltage;

wherein in response to the first electrode being at the first voltage level, the first active switch is turned on; in response to the first electrode being at the second voltage level, the second active switch is turned on.

7. The display panel as recited in claim 5, wherein the first active switch is a P-type thin film transistor, and the second active switch is an n-type thin film transistor.

8. The display panel as recited in claim 5, wherein a potential of the first voltage level lies in the range of 0 to a, and a potential of the second voltage level is not less than a, where a is an illumination starting voltage of each of the plurality of light-emitting elements.

9. The display panel as recited in claim 1, wherein at the position of each of the plurality of light-emitting elements, an orthogonal projection of the respective first electrode on the substrate overlaps or coincides with an orthogonal projection of the respective bottom electrode on the substrate, and wherein the first electrode is a transparent electrode.

10. The display panel as recited in claim 9, wherein at the position of each of the plurality of light-emitting elements, the respective first electrode and the respective bottom electrode are the same electrode.

11. The display panel as recited in claim 1, wherein the substrate comprises a driving backplate used to provide data signals for the plurality of light-emitting elements; wherein the electronically controlled switching layer is disposed between the driving backplate and the light-emitting element layer;

wherein the electronically controlled switching layer comprises a plurality of electronically controlled switching portions, wherein the plurality of electronically controlled switching portions are arranged in one-to-one correspondence with the plurality of first electrodes; wherein there is disposed a signal line between the adjacent electronically controlled switching portions; wherein one end of the signal line is connected to the first electrode or the bottom electrode, and wherein another end of the signal line is connected to a driving signal of the driving backplate.

12. The display panel as recited in claim 11, wherein there is disposed a shielding piece between every two adjacent electronically controlled switching portions, wherein the shielding piece is disposed corresponding to the non-opening region.

13. The display panel as recited in claim 1, wherein the display panel further comprises a pixel defining layer, an encapsulation layer, and a color filter layer; wherein the display panel comprises an opening region and a non-opening region; wherein the encapsulation layer is disposed to cover the plurality of light-emitting elements and the pixel defining layer; wherein the color filter layer is disposed on the encapsulation layer;

wherein the color filter layer comprises plurality of color filters, which are disposed in the opening region; wherein the plurality of color filters comprise a red color filter, a blue color filter, and a green color filter.

14. A display device, comprising a driving circuit and a display panel, wherein the driving circuit is used to drive the display panel for display; wherein the display panel comprises:

a substrate;

an electronically controlled switching layer, disposed on the substrate; and a light-emitting element layer, disposed on the electronically controlled switching layer and comprising a plurality of light-emitting elements; wherein each of the plurality of light-emitting elements comprises a bottom electrode, a light-emitting layer, and a top electrode that are stacked in sequence in a direction of getting farther away from the substrate; wherein the bottom electrode is a transparent electrode and is used to receive a data signal;

wherein the electronically controlled switching layer comprises a plurality of first electrodes, wherein the plurality of first electrodes are connected to the plurality of bottom electrodes in one-to-one correspondence, and wherein the plurality of first electrodes are used to control the electronically controlled switching layer to switch between a first state and a second state;

wherein in response to each of the plurality of light-emitting elements not emitting light, the electronically controlled switching layer enters the first state in which the electronically controlled switching layer is operative to absorb light passing through the bottom electrode;

wherein in response to each of the plurality of light-emitting elements emitting light, the electronically controlled switching layer enters the second state in which the electronically controlled switching layer is operative to reflect the light passing through the bottom electrode.

15. The display device as recited in claim 14, wherein there is disposed a plurality of double-sided twisting balls in the electronically controlled switching layer, wherein a first side of each of the plurality of double-sided twisting balls comprises a black light-absorbing layer, which is used to absorb the light passing through the bottom electrode;

wherein a second side of the double-sided twisting ball comprises a reflective layer, which is used to reflect the light passing through the bottom electrode; wherein the first side and second side of each of the plurality of double-sided twisting balls have different electrical polarities.

16. The display device as recited in claim 15, wherein the electronically controlled switching layer further comprises a plurality of second electrodes; wherein the plurality of first electrodes are disposed on the side of the plurality of double-sided twisting balls facing the plurality of light-emitting elements; wherein the plurality of second electrodes are disposed on the side of the plurality of double-sided twisting balls facing away from the plurality of light-emitting elements; wherein the plurality of first electrodes and the plurality of second electrodes are arranged facing each other in one-to-one correspondence, and wherein each first electrode and the respective second electrode have opposite electrical polarities;

wherein in response to each of the plurality of light-emitting elements not emitting light, the respective double-sided twisting balls under the light-emitting element enter the first state, in which the black light-absorbing layers of the respective double-sided twisting balls are disposed to face toward the light-emitting element;

wherein in response to each of the plurality of light-emitting elements emitting light, the respective double-sided twisting balls under the light-emitting element enter the second state, in which the reflective layers of the respective double-sided twisting balls are disposed to face toward the light-emitting element.

17. The display device as recited in claim 16, wherein the display panel comprises an opening region and a non-opening region, wherein the electronically controlled switching layer further comprises a plurality of third electrodes and a plurality of fourth electrodes, the plurality of third electrodes and the plurality of fourth electrodes being disposed in the non-opening region and corresponding to the pixel defining layer; wherein the plurality of third electrodes and the plurality of first electrodes are alternately arranged at intervals, and the plurality of fourth electrodes and the plurality of second electrodes are alternately arranged at intervals;

wherein the plurality of third electrodes are electrically connected to each other, and wherein the plurality of fourth electrodes are electrically connected to each other; wherein the plurality of third electrodes and the plurality of fourth electrodes are used to control the double-sided twisting balls corresponding to the non-opening region to be always in the first state.

18. The display device as recited in claim 14, wherein at the position of each of the plurality of light-emitting elements, an orthogonal projection of the respective first electrode on the substrate overlaps or coincides with an orthogonal projection of the respective bottom electrode on the substrate, and wherein the first electrode is a transparent electrode.

19. The display device as recited in claim 18, wherein at the position of each of the plurality of light-emitting elements, the respective first electrode and the respective bottom electrode are the same electrode.

* * * * *